(12) United States Patent
Ryu et al.

(10) Patent No.: US 7,535,942 B2
(45) Date of Patent: May 19, 2009

(54) SEMICONDUCTOR LASER DEVICE INCLUDING A LIGHT SHIELD PLATE, SEMICONDUCTOR LASER DEVICE PACKAGE, AND METHODS OF MANUFACTURING THE SAME

(75) Inventors: Han-youl Ryu, Suwon-si (KR); Hyung-kun Kim, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 22 days.

(21) Appl. No.: 11/907,879

(22) Filed: Oct. 18, 2007

(65) Prior Publication Data

US 2008/0101422 A1 May 1, 2008

(30) Foreign Application Priority Data

Oct. 27, 2006 (KR) ............... 10-2006-0105041

(51) Int. Cl.
*H01S 3/09* (2006.01)
*H01S 5/00* (2006.01)

(52) U.S. Cl. ............... 372/43.01; 372/49.01; 372/99
(58) Field of Classification Search ............ 372/43.01, 372/46.014, 49.01, 50.1, 99
See application file for complete search history.

(56) References Cited

FOREIGN PATENT DOCUMENTS

JP   2005-101457   4/2005

*Primary Examiner*—Armando Rodriguez
(74) *Attorney, Agent, or Firm*—Harness, Dickey & Pierce, P.L.C.

(57) ABSTRACT

Provided is a semiconductor laser device, a semiconductor laser device package including the semiconductor laser device and methods of manufacturing the same. A semiconductor laser device may include a light emission structure including a first clad layer, an active layer and a second clad layer sequentially deposited on a substrate, a submount to which the light emission structure bonded, and a light shield plate in the submount, wherein the light shield plate blocks an end of the substrate on a light emission face of the light emission structure and blocks light leaked through the end of the substrate.

24 Claims, 6 Drawing Sheets

FIG. 1A (CONVENTIONAL ART)

FAR FIELD ANGLE

FIG. 1B (CONVENTIONAL ART)

FAR FIELD ANGLE

FIG. 7

SEMICONDUCTOR LASER DEVICE INCLUDING A LIGHT SHIELD PLATE, SEMICONDUCTOR LASER DEVICE PACKAGE, AND METHODS OF MANUFACTURING THE SAME

PRIORITY STATEMENT

This application claims priority under 35 U.S.C. § 119 to Korean Patent Application No. 10-2006-0105041, filed on Oct. 27, 2006, in the Korean Intellectual Property Office (KIPO), the entire contents of which are incorporated herein by reference.

BACKGROUND

1. Field

Example embodiments relate to a semiconductor laser device, a semiconductor laser device package and methods of manufacturing the same. Other example embodiments relate to a semiconductor laser device including a light shield plate, a semiconductor laser device package and methods of manufacturing the same.

2. Description of the Related Art

A laser, which mainly emits bluish purple light, may be manufactured using semiconductor material. Semiconductor laser devices may emit laser light from ultraviolet rays of a wavelength of about 360 nm to bluish green light of a wavelength of about 490 nm, and lasers in blue and purple regions of wavelengths of about 400 nm-about 450 nm may be used in various fields. Semiconductor laser devices having a wavelength of about 405 nm may be used as a light source of next-generation increased-capacity optical storage media, e.g., blu-ray disks (BD) and high-definition digital versatile disks (HD DVD). Semiconductor laser devices having a wavelength of about 450 nm may be used as a blue light source of laser display systems.

When semiconductor laser devices having wavelengths of about 500 nm or higher are available, the semiconductor laser devices may also be used as a green light source of laser display systems. Also, blue-purple semiconductor laser devices may be used as a light source of high-resolution laser printers. Semiconductor laser devices having relatively short wavelengths of about 400 nm or lower in the ultraviolet ray region may be manufactured using nitride semiconductor materials and applied for a biological or medical use. In nitride semiconductor laser devices, when an aluminum (Al) composition in the n-clad layer, which is formed of AlGaN, is not sufficiently high or when the n-clad layer is not sufficiently thick, the optical confinement may weaken, and thus, light may be leaked from a lower surface of the n-clad layer.

In nitride semiconductor laser devices employing a sapphire substrate, light leaked from a lower surface of the n-clad layer may exist in an n-contact layer between the sapphire substrate and n-clad layer, and a portion of the leaked light may further leak out of the laser device through a cross-sectional end of the substrate and the n-contact layer that is the end of the laser device from which the laser beam emerges. Also, in nitride semiconductor laser devices grown on a GaN substrate, light leaked from a lower surface of the n clad-layer may exist inside the substrate, and a portion of the leaked light may further leak out of the laser device through a cross-sectional end of the substrate that is the end of the laser device from which the laser beam emerges. The leaked light may interfere with a far-field pattern of the laser beam emerging from the semiconductor laser devices, illustrated by the formation of ripples in the graphs illustrated in FIGS. 1A and 1B.

The ripples in the far-field pattern may cause problems in applying the blue-purple semiconductor laser device to a system. For example, when using the blue-purple semiconductor laser devices as blue light source of laser displays, the ripples may make display images uneven and thus deteriorate the quality of screen displays. Also, when used as a light source of optical storage media, the ripple shapes may increase noise, and thus, errors in reading signals during information reproduction, which erodes reliability of the optical pickup.

To decrease the ripples in the far-field pattern, light leakage down from the n-clad layer may be blocked. The optical confinement may be improved by increasing the Al composition ratio in the n-clad layer or making the n-clad layer thicker. However, these methods may be limited because compositions including undesirable amounts of aluminum (Al) or undesirably thick n-clad layers may increase the probability of inducing cracks during growth for semiconductor laser devices. Light leakage may also increase for longer wavelengths of light, which is a drawback with respect to applications, e.g., a source for laser displays.

The conventional art discloses a technique which stops light leakage through a substrate by depositing a light shield membrane on the cross-sectional end of the substrate, which is on the end of the laser device through which a laser beam emerges. According to the conventional art, a semiconductor laser device may be attached to a jig which may screen a region where the light shield membrane should not be formed on the light emission face of semiconductor laser device, so that the light shield membrane may then be deposited on appropriate regions of the end of the substrate.

However, the thickness of the region where the light shield membrane should not be formed may be only a few micrometers, making it difficult to manufacture the jig which may screen the region. If the jig screens the cross-sectional end of the substrate, the light shield membrane may not be sufficiently formed and light leakage may not be sufficiently blocked. In addition, micrometer accuracy may be required when attaching the semiconductor laser device to the jig, but maintaining this degree of accuracy may be difficult. Therefore, the probability that light emission capacity may be deteriorated due to the light emission face being damaged during attachment of the jig to the semiconductor laser device may increase.

SUMMARY

Example embodiments provide a semiconductor laser device having a light shield plate which prevents or reduces light leakage through a substrate thereof formed to correspond to an area of a light emergence end of the semiconductor device excluding a light emission structure from which a laser beam emerges, a semiconductor laser device package including the semiconductor laser and methods of manufacturing the same.

According to example embodiments, a semiconductor laser device may include a light emission structure including a first clad layer, an active layer, and a second clad layer sequentially deposited on a substrate, a submount bonded to the light emission structure, a light shield plate in the submount, wherein the light shield plate blocks an end of the substrate on a light emission face of the light emission structure and blocks light leaked through the end of the substrate.

According to example embodiments, the light shield plate may block light leaked through the end of the substrate when the light emission structure is bonded to the submount. According to example embodiments, a portion of the second clad layer may protrude upward to form a ridge waveguide and the width of the light shield plate may be greater than the width of the ridge waveguide. According to example embodiments, the light shield plate may be formed of a material containing at least one of Si, SiC, SiN, AlN and metal substances. According to example embodiments, the substrate may be one of a GaN substrate, a SiC substrate and a sapphire substrate. According to example embodiments, the first clad layer, the active layer, and the second clad layer may be formed of $Al_xGa_{1-x}In_yN_{1-y}$ ($0 \leq x \leq$ about 0.3, $0 \leq y \leq$ about 0.3). According to example embodiments, a gap may be formed between the light shield plate and a light emission face of the light emission structure.

According to example embodiments, a semiconductor laser device package may include a light emission structure including a first clad layer, an active layer, and a second clad layer sequentially deposited on a substrate, a submount bonded to the light emission structure; a stem connected to the submount, and a light shield plate formed in the stem to block an end of the substrate on a light emission face of the light emission structure and block light leaked through the end of the substrate.

According to example embodiments, a portion of the second clad layer may protrude upward to form a ridge waveguide, and the width of the light shield plate may be greater than the width of the ridge waveguide. According to example embodiments, the substrate may be one of a GaN substrate, a SiC substrate and a sapphire substrate. According to example embodiments, the first clad layer, the active layer and the second clad layer may be formed of $Al_xGa_{1-x}In_yN_{1-y}$ (about $0 \leq x \leq$ about 0.3, about $0 \leq y \leq$ about 0.3). According to example embodiments, a gap may be formed between the light shield plate and the light emission face of the light emission structure.

According to example embodiments, a method of manufacturing a semiconductor laser device may include depositing a light emission structure including a first clad layer, an active layer, and a second clad layer, respectively, on a substrate, bonding a submount to the light emission structure, and forming a light shield plate in the submount, wherein the light shield plate blocks an end of the substrate on a light emission face of the light emission structure and blocks light leaked through the end of the substrate.

According to example embodiments, a method of manufacturing a semiconductor laser device package may include depositing a light emission structure including a first clad layer, an active layer, and a second clad layer, respectively, on a substrate, bonding a submount to the light emission structure, forming a stem, forming a light shield plate in the stem, and connecting the submount to the stem, wherein the light shield plate blocks an end of the substrate on a light emission face of the light emission structure and blocks light leaked through the end of the substrate.

BRIEF DESCRIPTION OF THE DRAWINGS

Example embodiments will be more clearly understood from the following detailed description taken in conjunction with the accompanying drawings. FIGS. 1A-7 represent non-limiting, example embodiments as described herein.

It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. In particular, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF EXAMPLE EMBODIMENTS

Example embodiments will now be described more fully with reference to the accompanying drawings, in which example embodiments are shown. In the drawings, the thicknesses of layers and regions are exaggerated for clarity. Example embodiments may, however, be embodied in many different forms and should not be construed as being limited to the embodiments set forth herein. Rather, these embodiments are provided so that this disclosure will be thorough and complete, and will fully convey the scope of example embodiments to those skilled in the art. Like numbers refer to like elements throughout the specification.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
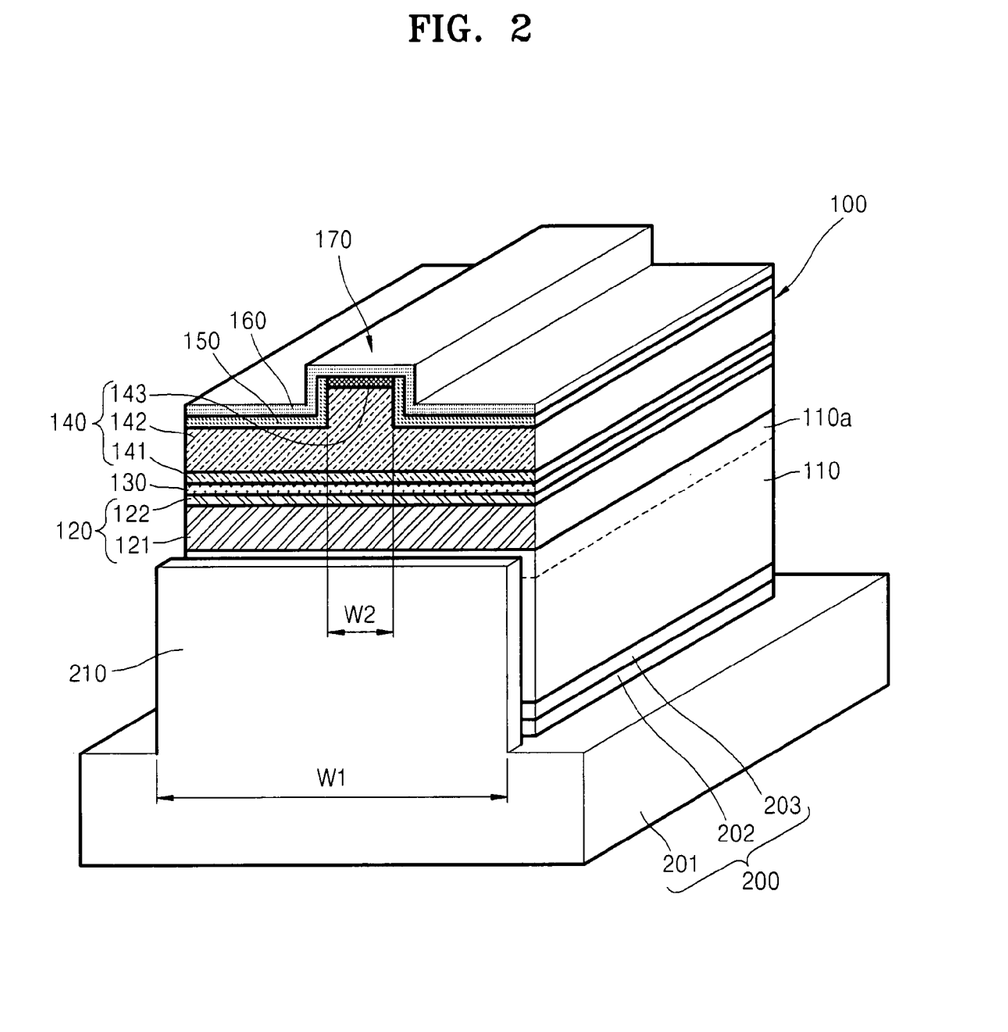
FIG. 2 is a perspective view of a semiconductor laser device according to example embodiments.
Figure 3:
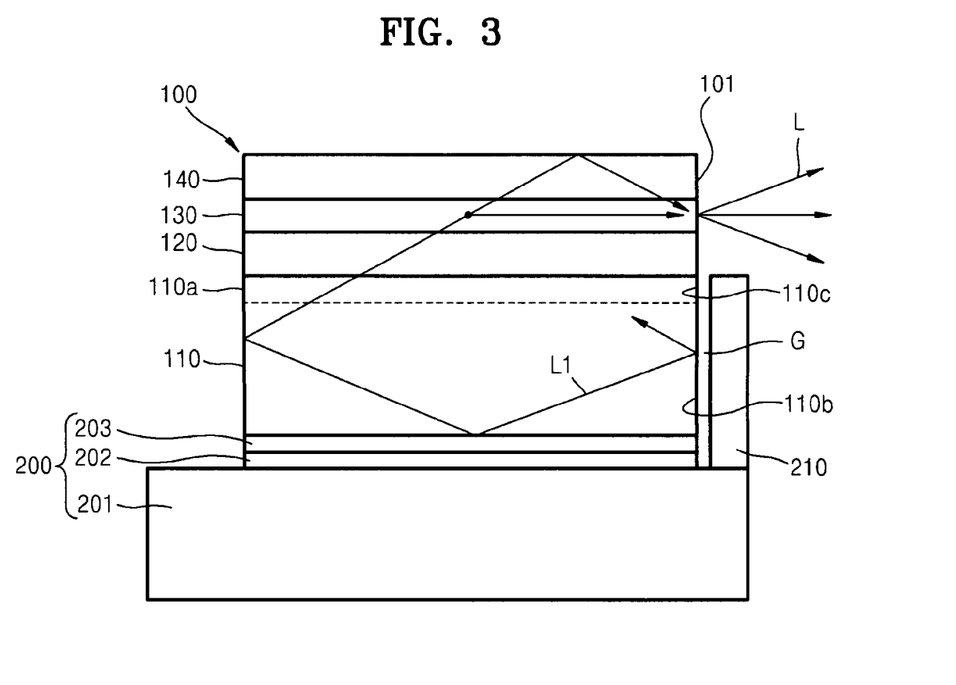
FIG. 3 is a side view of the semiconductor laser device of FIG. 2.

FIG. 2 is a perspective view of a semiconductor laser device according to example embodiments, and FIG. 3 is a side view of the semiconductor laser device in FIG. 2. FIGS. 2 and 3 are exaggerated to clearly illustrate features of the semiconductor laser device according to example embodiments. The semiconductor laser device of example embodiments may be a GaN Group III-V nitride semiconductor laser device.

Referring to FIG. 2, a light emission structure 100 may be formed by sequentially depositing a first material layer 120, an active layer 130 and a second material layer 140 on a substrate 110. The substrate 110 may be a Group III-V nitride compound semiconductor layer substrate, e.g., a GaN and/or a SiC, and/or a highly resistive substrate, e.g., a sapphire substrate. When employing a GaN or SiC substrate as the substrate 110, a vertical light emission structure 100 may be more easily formed.

The first material layer 120 may include a first clad layer 121. The first clad layer 121 may be, for example, an n-AlGaN/GaN layer. A first waveguide layer 122 may be a GaN-based Group III-V nitride semiconductor layer, e.g., n-GaN layer. The first waveguide layer 122 may have a refractive index lower than that of the active layer 130 and higher than that of the first clad layer 121.

The active layer 130 may be a material layer that emits light by the coupling of carriers, e.g., electrons and holes, and may be a GaN-based Group III-V nitride semiconductor layer having a multi-quantum well (MQW) structure. The active layer 130 may be a material layer formed by adding Indium (In) to the GaN based Group III-V nitride semiconductor layer at a predetermined or given ratio, for example, an InGaN layer.

The second material layer 140 may include a second wave guide layer 141, a second clad layer 142 and a cap layer 143. The second clad layer 142 may be the same material layer as the first clad layer 121 except that the p-type material is doped. A portion of the second clad layer 142 may protrude upward in order to form a ridge wave guide 170. A second wave guide layer 141 may be a GaN based Group III-V nitride semiconductor layer, e.g., a p-GaN layer. The second wave guide layer 141 may have a refractive index lower than that of the active layer 130 and higher than that of the second clad layer 142.

The composition of the first clad layer 121, the active layer 130, and the second clad layer 142 may be represented as $Al_xGa_{1-x}In_yN_{1-y}$ ($0 \leq x \leq$ about 0.3, $0 \leq y \leq$ about 0.3). The cap layer 143 may be a GaN-based Group III-V nitride semiconductor layer, and may be a direct transition type semiconductor layer, doped with p-type conductive impurities, for example, a p-GaN layer. Otherwise, the cap layer 143 may be a GaN layer, AlGaN layer and/or an InGaN layer including Al or In.

A p-type electrode layer 160 may be electrically connected to the cap layer 143, and a current restriction layer 150 may allow the p-type electrode layer 160 to limitedly contact the cap layer 143. When employing a sapphire substrate as the substrate 110, a contact layer 110a may further be formed between the substrate 110 and second clad layer 142 for supplying electrical current to the second clad layer 142. The contact layer 110a may be formed of $Al_xGa_{1-x}N$ ($0 \leq x \leq$ about 0.05).

A submount 200 may include a submount substrate 201, a metal layer 202, which supplies electrical current to the first material layer 120 and may be formed on the submount substrate 201, and a bonding metal layer 203, which bonds the metal layer 202 to the substrate 110 and may be formed on the metal layer 202. The structure of the submount 200 is known to those of ordinary skill in the art and thus further explanation thereof will be omitted.

The light emission structure 100 and submount 200 may be bonded together by putting the light emission structure 100 on the submount 200 and then melting the bonding metal layer 203. The semiconductor laser device according to example embodiments may include a light shield plate 210 included in the submount. The light shield plate 210 may be formed of a material which reflects or absorbs light. The light shield plate 210 may be formed of the same material as the submount substrate 201 and incorporated therein. The light shield plate 210 may be formed on the submount substrate 201 by deposition. Methods of forming the light shield plate 210 on the submount 200 are not limited to a particular method as long as the light shield plate 210 may be formed with a predetermined or given height. The light shield plate 210 may be formed of a material containing, for example, at least one of Si, SiC, SiN, AlN, and metal material.

Referring to FIG. 3, the height of the light shield plate 210 may be enough to cover at least 50% of the end 110b of the substrate 110 on the light emission face 101. For example, the light shield plate 210 may cover the entire end 110b of the substrate 110 on the light emission face 101. Also, when the n-contact layer 110a is formed, the light shield plate 210 may be formed to also cover the end 110c of the contact layer 110a, e.g., n-contact layer 110a, on the light emission face 101.

Referring back to FIG. 2, light generated from the active layer 130 may be emitted mostly through an area corresponding to the width W2 of the ridge waveguide 170. Therefore, the width W1 of light shield plate 210 may be at least greater than the width W2 of the ridge waveguide 170. The semiconductor laser device having the light shield plate 210 covering at least half of the end 110b of substrate 110 as illustrated in FIGS. 2 and 3 may be formed by bonding the light emission structure 100 and the submount 200. A gap G may exist between the light emission face 101 of the light emission structure 100 and the light shield plate 210, however, a gap is not required therebetween. By forming the gap G, damage to the light emission face 101 of light emission structure 100 may be prevented or reduced during bonding of the light emission structure 100 to the submount 200. The semiconductor laser device package may be formed by attaching the semiconductor laser device in the form illustrated in FIGS. 2 and 3 on a stem and packaging with housing.

Figure 1A:
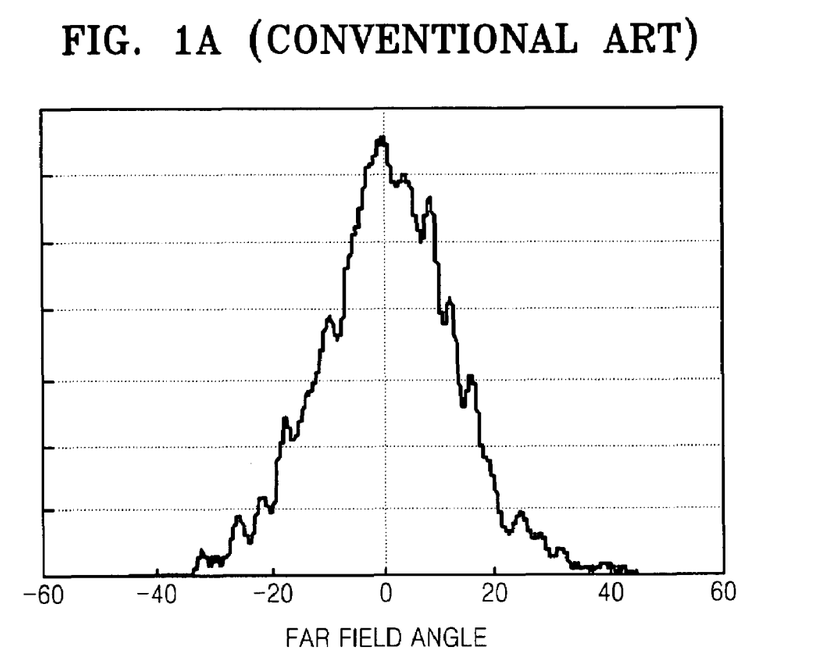
FIG. 1A is a graph illustrating ripples of a far-field pattern of a laser beam produced by a conventional nitride semiconductor laser device employing a sapphire substrate.
Figure 1B:
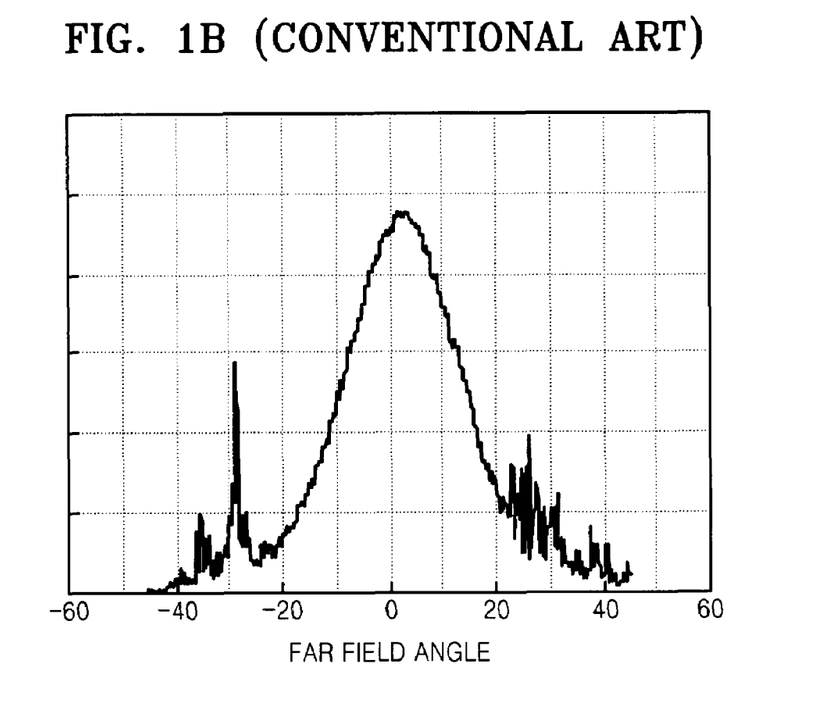
FIG. 1B is a graph illustrating ripples of a far-field pattern of a laser beam produced by a conventional nitride semiconductor laser device employing a GaN substrate.
Figure 4:
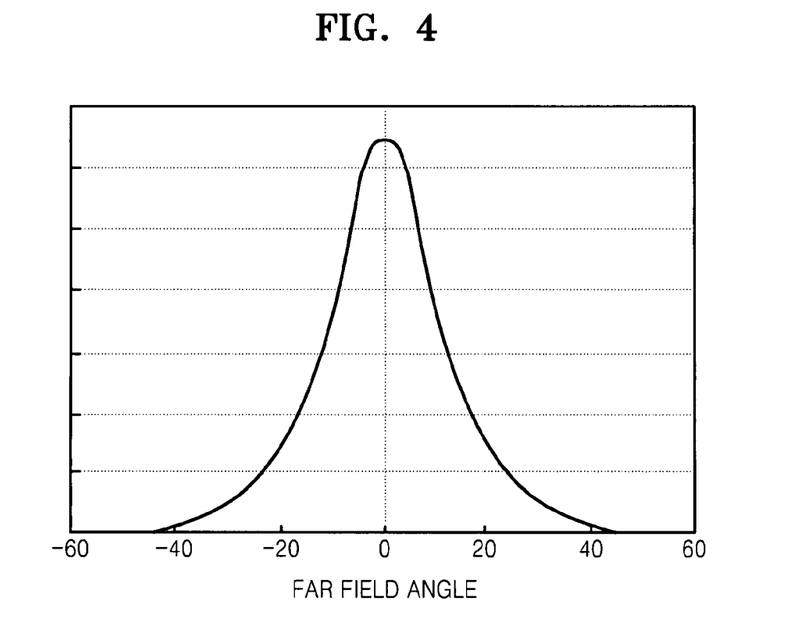
FIG. 4 is a graph illustrating a far-field pattern of a laser beam produced by a semiconductor laser device according to example embodiments.

When the first and second material layers 120 and 140 are supplied with electrical current, light emission may occur in the active layer 130 by an electron-hole carrier recombination of electron-hole. The first and second waveguide layers 122 and 141, which are located respectively below and above the active layer 130, may amplify light emitted from the active layer 130. The amplified light (L) may be emitted through the light emission face 101 of light emission structure 100. A portion of light L1 generated from the active layer 130 may leak through the first clad layer 121 to the contact layer 110a and the substrate 110. The light L1, which leaks through the end 110b of the substrate 110 or the end 110c of the contact layer 110a, may cause interference in the far-field pattern of light and thus may form ripples in the far-field pattern as illustrated in FIGS. 1A and 1B. According to the semiconductor laser device of example embodiments illustrated in FIG. 3, the light L1, which leaks to the contact layer 110a and the substrate 110, may be intercepted by the light shield plate 210, and thus, light leakage through the end 110b of the substrate 110 or the end 110c of the contact layer 110a may not occur. As a result, an increased quality of light with no ripples in the far-field pattern, as illustrated in FIG. 4, may be obtained.

Figure 5:
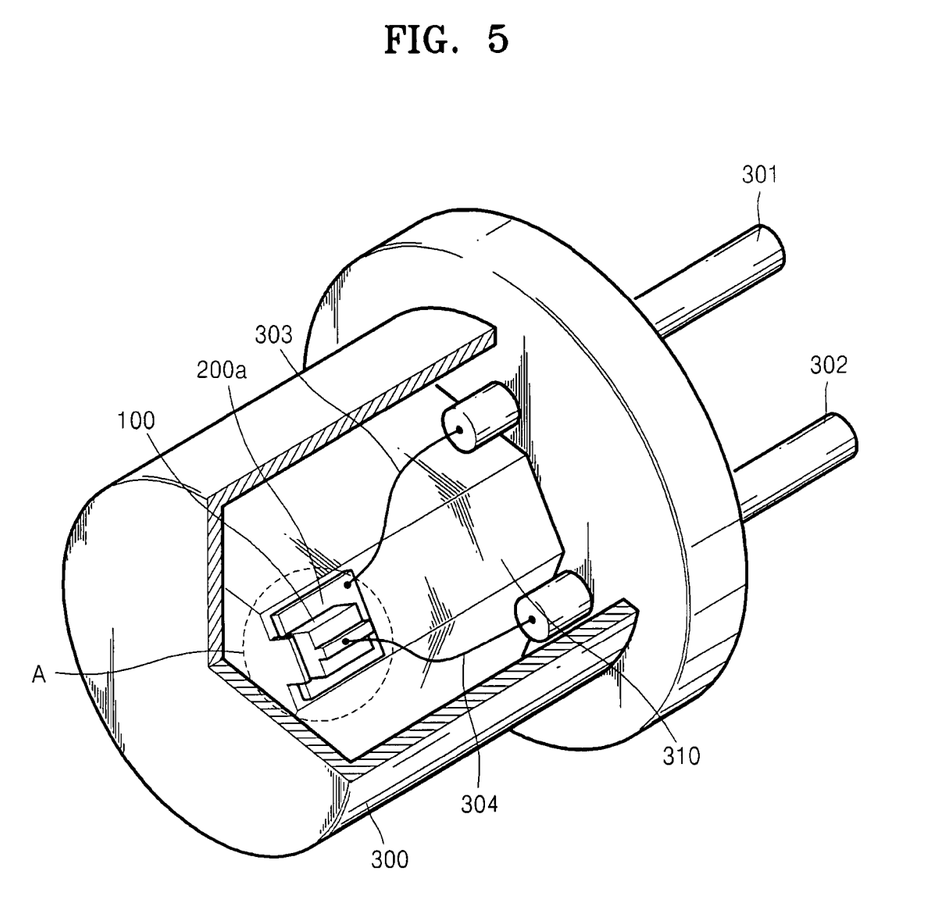
FIG. 5 is a partial cutaway perspective view of a package of a semiconductor laser device according to example embodiments.
Figure 6:
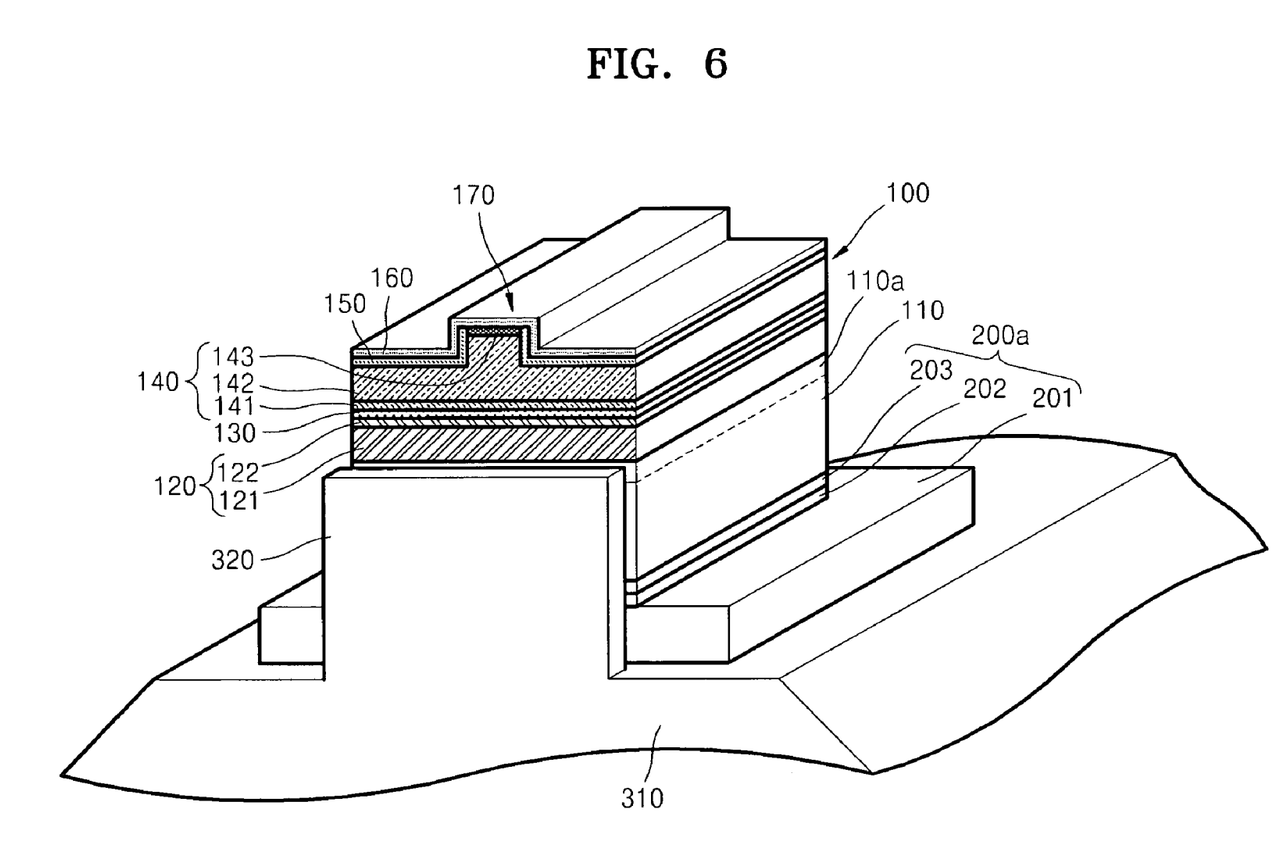
FIG. 6 is an enlarged view of part A of FIG. 5.

FIG. 5 is a partial-cutaway perspective view of a nitride semiconductor laser device package according to example embodiments, and FIG. 6 is an enlarged view of part A of FIG. 5. The light emission structure 100 is the same as explained in FIG. 2, and thus, explanation thereof is omitted here. The submount 200a is the same as the submount 200 illustrated in FIG. 2 except that the light shield plate 210 is not included, and thus, explanation thereof is omitted here. The light emission structure 100 may be bonded to the submount 200a. Referring to FIGS. 5 and 6, a stem 310, inside a housing 300, to which a submount 200a having the light emission structure 100 mounted thereon, may be attached. Leads 301 and 302 may be respectively electrically connected to the metal layer 202 of submount 200a and the ridge waveguide 170 through wires 303 and 304.

Referring to FIG. 6, the stem 310 of the semiconductor laser device package according to example embodiments may include a light shield plate 320. The stem 310 may be made of metals, e.g., Cu and/or Fe. The light shield plate 320 may be formed in the stem 310 without much difficulty. The height of the light shield plate 320 may be enough to cover about 50% of the end 110b of the substrate 110 on the light emission face 101, and may be enough to cover all of the end 110b of the substrate 110 on the light emission face 101. When an n-contact layer 110a is formed, the light shield plate 320 may cover the end 110c of the n-contact layer 110a on the light emission face 101. Also, the width of the light shield plate 320 may be at least greater than the width W2 of the ridge waveguide 170.

Figure 7:
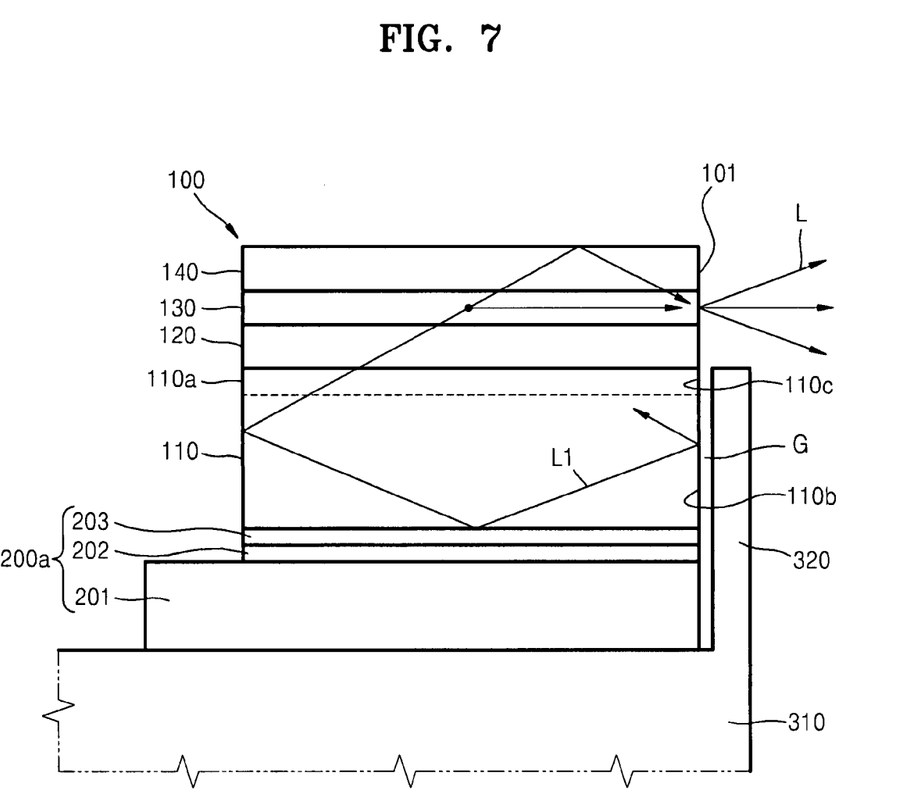
FIG. 7 is an enlarged side view of part A of FIG. 5.

By attaching the submount 200a having the light emission structure 100 mounted thereon, to the stem 310, a semiconductor laser device package may be formed, wherein the end 110b of the substrate 110 may be covered by the light shield plate 320 as illustrated in FIG. 7. Also, a gap G may be formed between the light emission face 101 of the light emission structure 100 and the light shield plate 320. By forming a gap G, damage to the light emission face 101 of light emission structure 100 may be prevented or reduced during attachment of the submount 200a having the light emission structure 100 mounted thereon, to the stem 310.

In the structure as described above, light leakage through the end 110b of the substrate 110 or the end 110c of the contact layer 110a may not occur because light, which is leaked to the contact layer 110a and the substrate 110, may be blocked by the light shield plate 320. Therefore, an increased quality of light in a far-field pattern having no ripples as illustrated in FIG. 4 may be obtained. As described above, the effects of semiconductor laser device and package thereof according to example embodiments are as follows.

The manufacturing process may be simplified and the risk of damaging the light emission structure during formation of the light shield plate may be reduced compared to the method of depositing the light shield plate on the light emission structure itself because the light shield plate may not be formed in the light emission structure but in the submount or in the stem of the package. Also, the risk of damaging the light emission face during assembly may be reduced by forming a gap between the light shield plate and the light emission face of the light emission structure.

While example embodiments have been particularly shown and described with reference to example embodiments thereof, it will be understood by those of ordinary skill in the art that various changes in form and details may be made therein without departing from the spirit and scope as defined by the following claims.

What is claimed is:

1. A semiconductor laser device comprising:
   a light emission structure including a first clad layer, an active layer, and a second clad layer sequentially deposited on a substrate;
   a submount bonded to the light emission structure; and
   a light shield plate in the submount, wherein the light shield plate blocks an end of the substrate on a light emission face of the light emission structure and blocks light leaked through the end of the substrate.

2. The semiconductor laser device of claim 1, wherein the light shield plate blocks light leaked through the end of the substrate when the light emission structure is bonded to the submount.

3. The semiconductor laser device of claim 1, wherein a portion of the second clad layer protrudes upward to form a ridge waveguide and the width of the light shield plate is greater than the width of the ridge waveguide.

4. The semiconductor laser device of claim 1, wherein the light shield plate is formed of a material containing at least one of Si, SiC, SiN, AlN and metal substances.

5. The semiconductor laser device of claim 1, wherein the substrate is one of a GaN substrate, a SiC substrate and a sapphire substrate.

6. The semiconductor laser device of claim 1, wherein the first clad layer, the active layer, and the second clad layer are formed of $Al_xGa_{1-x}In_yN_{1-y}$ ($0 \leq x \leq 0.3$, $0 \leq y \leq 0.3$).

7. The semiconductor laser device of claim 1, wherein a gap is formed between the light shield plate and a light emission face of the light emission structure.

8. A semiconductor laser device package comprising:
   a light emission structure including a first clad layer, an active layer, and a second clad layer sequentially deposited on a substrate;
   a submount bonded to the light emission structure; a stem connected to the submount; and
   a light shield plate formed in the stem to block an end of the substrate on a light emission face of the light emission structure and block light leaked through the end of the substrate.

9. The semiconductor laser device package of claim 8, wherein a portion of the second clad layer protrudes upward to form a ridge waveguide and the width of the light shield plate is greater than the width of the ridge waveguide.

10. The semiconductor laser device package of claim 8, wherein the substrate is one of a GaN substrate, a SiC substrate and a sapphire substrate.

11. The semiconductor laser device package of claim 8, wherein the first clad layer, the active layer and the second clad layer are formed of $Al_xGa_{1-x}In_yN_{1-y}$ ($0 \leq x \leq 0.3$, $0 \leq y \leq 0.3$).

12. The semiconductor laser device package of claim 8, wherein a gap is formed between the light shield plate and the light emission face of the light emission structure.

13. A method of manufacturing a semiconductor laser device comprising:
    depositing a light emission structure including a first clad layer, an active layer, and a second clad layer, respectively, on a substrate;
    bonding a submount to the light emission structure; and
    forming a light shield plate in the submount, wherein the light shield plate blocks an end of the substrate on a light emission face of the light emission structure and blocks light leaked through the end of the substrate.

14. The method of claim 13, wherein the light shield plate blocks the light leaked through the end of the substrate when the light emission structure is bonded to the submount.

15. The method of claim 13, wherein a portion of the second clad layer protrudes upward to form a ridge waveguide and the width of the light shield plate is greater than the width of the ridge waveguide.

16. The method of claim 13, wherein the light shield plate is formed of a material containing at least one of Si, SiC, SiN, AlN and metal substances.

17. The method of claim 13, wherein the substrate is one of a GaN substrate, a SiC substrate and a sapphire substrate.

18. The method of claim 13, wherein the first clad layer, the active layer, and the second clad layer are formed of $Al_xGa_{1-x}In_yN_{1-y}$ ($0 \leq x \leq 0.3$, $0 \leq y \leq 0.3$).

19. The method of claim 13, wherein a gap is formed between the light shield plate and a light emission face of the light emission structure.

20. A method of manufacturing a semiconductor laser device package comprising:
    depositing a light emission structure including a first clad layer, an active layer, and a second clad layer, respectively, on a substrate;
    bonding a submount to the light emission structure;
    forming a stem;
    forming a light shield plate in the stem; and
    connecting the submount to the stem,
    wherein the light shield plate blocks an end of the substrate on a light emission face of the light emission structure and blocks light leaked through the end of the substrate.

21. The method of claim 20, wherein a portion of the second clad layer protrudes upward to form a ridge waveguide and the width of the light shield plate is greater than the width of the ridge waveguide.

22. The method of claim 20, wherein the substrate is one of a GaN substrate, a SiC substrate and a sapphire substrate.

23. The method of claim 20, wherein the first clad layer, the active layer and the second clad layer are formed of $Al_xGa_{1-x}In_yN_{1-y}$ ($0 \leq x \leq 0.3$, $0 \leq y \leq 0.3$).

24. The method of claim 20, wherein a gap is formed between the light shield plate and the light emission face of the light emission structure.

* * * * *